US010849227B1

(12) United States Patent
Whatcott et al.

(10) Patent No.: US 10,849,227 B1
(45) Date of Patent: Nov. 24, 2020

(54) CASCADING POWER BUS FOR CIRCUIT CARD ASSEMBLY STACKS

(71) Applicant: Simmonds Precision Products, Inc., Vergennes, VT (US)

(72) Inventors: Neal R. Whatcott, Carver, MN (US); Jason Graham, Prior Lake, MN (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 16/846,735

(22) Filed: Apr. 13, 2020

(51) Int. Cl.
*H05K 1/11* (2006.01)

(52) U.S. Cl.
CPC ....... *H05K 1/116* (2013.01); *H05K 2201/093* (2013.01); *H05K 2201/09545* (2013.01); *H05K 2201/10287* (2013.01)

(58) Field of Classification Search
CPC ......... H05K 1/116; H05K 2201/10287; H05K 2201/09545; H05K 2201/093
USPC ........................................................ 174/262
See application file for complete search history.

(56) References Cited

U.S. PATENT DOCUMENTS

| 7,045,440 | B2 | 5/2006 | Huff et al. | |
|---|---|---|---|---|
| 10,091,873 | B1 | 10/2018 | Xiong | |
| 10,123,419 | B2 | 11/2018 | Pihlman et al. | |
| 10,128,177 | B2 | 11/2018 | Kamgaing et al. | |
| 2006/0050491 | A1* | 3/2006 | Hayashi | H05K 1/0231 361/760 |
| 2007/0136618 | A1* | 6/2007 | Ohsaka | H05K 1/0231 713/323 |
| 2019/0020130 | A1* | 1/2019 | DeAngelo | H05K 3/007 |

* cited by examiner

*Primary Examiner* — Sherman Ng
(74) *Attorney, Agent, or Firm* — Locke Lord LLP; Joshua L. Jones; Scott D. Wofsy

(57) ABSTRACT

A circuit card assembly (CCA) stack includes a first circuit card assembly (CCA) with circuit components mounted thereto, wherein the first CCA includes a power contact and a return contact for powering the first CCA. A plurality of additional CCAs in a stack with the first CCA, wherein each CCA in the plurality of additional CCAs includes respective power and return contacts, and wherein each CCA in the plurality of additional CCAs includes a first aperture and a second aperture for passage of power buses. The first power bus can include one or more power wires bonded to power contacts of the CCAs, and one or more return wires bonded to return contacts of the CCAs.

17 Claims, 1 Drawing Sheet

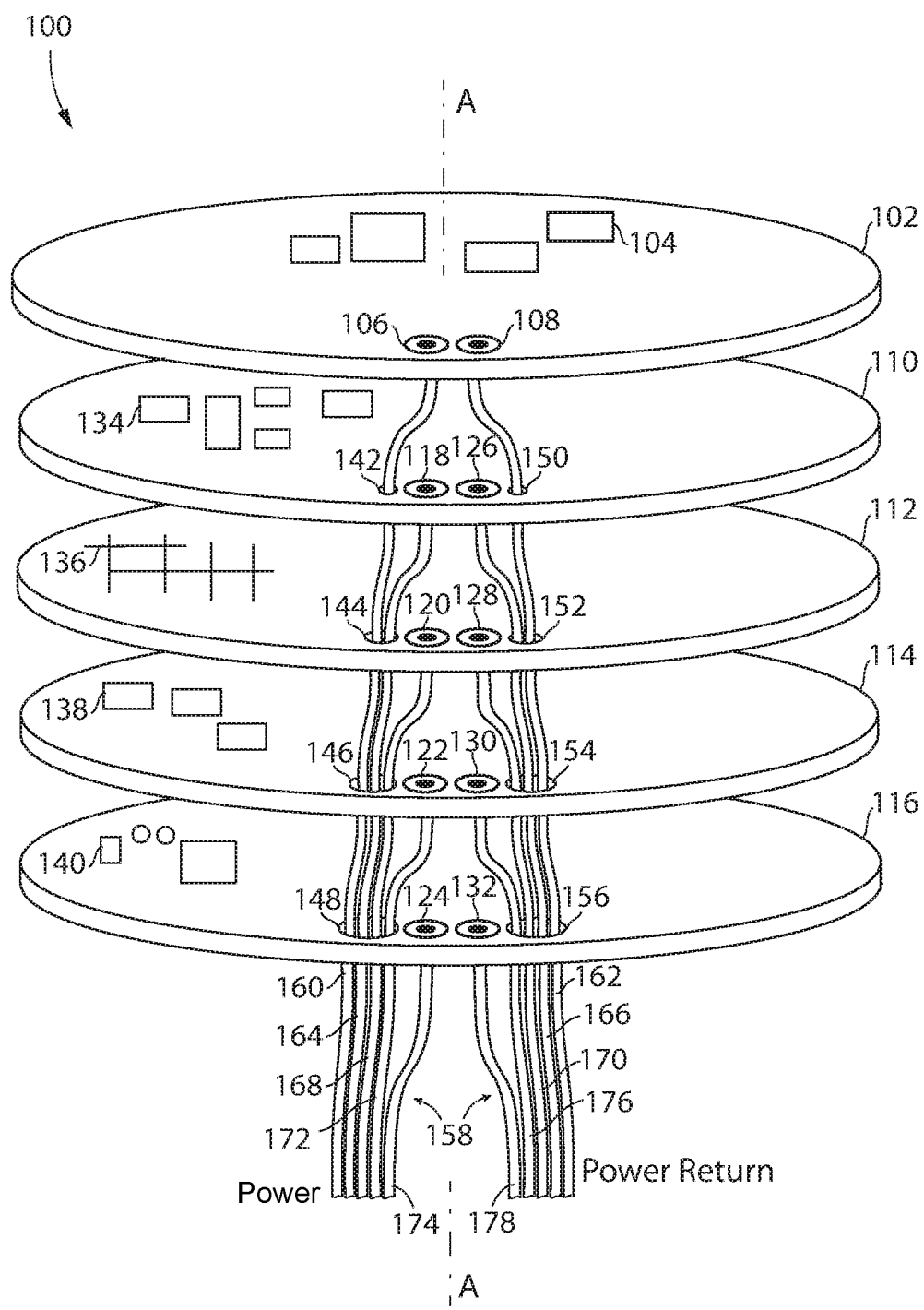

CASCADING POWER BUS FOR CIRCUIT CARD ASSEMBLY STACKS

BACKGROUND

1. Field

The present disclosure relates to circuit card assemblies and more particularly to providing power to circuit card assemblies.

2. Description of Related Art

Powering high current power buses into multiple circuit cart assembly (CCA) stacks can be a challenge, e.g. when it is desirable to keep the bus within the footprint of the CCA boards. It is also a challenge to have power buses that do not interfere with components on mostly populated CCAs. Typically, high current connections require relatively large conductive paths, in comparison to signal connections. If power is sent through connectors designed for signals, the power must be distributed through multiple pins and the pins must be derated. This takes up valuable pins that must be used for transferring signals between CCA boards. In addition, if the stack is used in an application that places it in compression, e.g. for high acceleration applications, power bus connections need to be allowed to freely move or flex, to accommodate for loss of stack height due to compression.

The conventional techniques have been considered satisfactory for their intended purpose. However, there is an ever present need for improved systems and methods for delivering power to CCA stacks. This disclosure provides a solution for this need.

SUMMARY

A circuit card assembly (CCA) stack includes a first circuit card assembly (CCA) with circuit components mounted thereto, wherein the first CCA includes a power contact and a return contact for powering the first CCA. A plurality of additional CCAs in a stack with the first CCA, wherein each CCA in the plurality of additional CCAs includes respective power and return contacts, and wherein each CCA in the plurality of additional CCAs includes a first aperture and a second aperture for passage of power buses.

The respective first apertures of the additional CCAs can increase in size the further the respective one of the additional CCAs is in the stack from the first CCA, and the respective second apertures of the additional CCAs can increase in size the further the respective one of the additional CCAs is in the stack from the first CCA. The power and return contacts of each CCA in the plurality of additional CCAs can be between the first and second apertures of the respective CCA. The respective power and return contacts can be plated vias.

The first CCA can have a first power bus electrically connected to the first CCA. A second CCA with circuit components mounted thereto, can be stacked onto the first CCA, wherein the first power bus passes through an aperture in the second CCA, and wherein a second power bus is electrically connected to the second CCA. The first power bus can include a first power wire bonded to a power contact of the first CCA, wherein the first power bus includes a first return wire bonded to a return contact of the first CCA. The aperture in the second CCA can be a first aperture, wherein the first power wire passes through the first aperture of the second CCA. The second CCA can include a second aperture, wherein the first return wire passes through the second aperture of the second CCA. The first power wire can pass loosely through the first aperture of the second CCA, and the first return wire can pass loosely through the second aperture of the second CCA.

A third CCA with circuit components mounted thereto can be stacked onto the second CCA, wherein the first and second power buses pass through an aperture in the third CCA, and wherein a third power bus is electrically connected to the third CCA. The second power bus can include a second power wire bonded to a power contact of the second CCA, and the second power bus can include and a second return wire bonded to a return contact of the second CCA. The aperture in the third CCA can be a first aperture, wherein the first and second power wires pass through the first aperture of the third CCA. The third CCA can include a second aperture, and the first and second return wires can pass through the second aperture of the third CCA. The first and second power wires can pass loosely through the first aperture of the third CCA, and the first and second return wires can pass loosely through the second aperture of the third CCA. The third power bus can include a third power wire bonded to a power contact of the third CCA, and the third power bus can include and a third return wire bonded to a return contact of the third CCA.

The power contacts of the first, second, and third CCAs can be axially aligned in an axial direction relative to a stack axis along which the first, second, and third CAAs are stacked. The return contacts of the first, second, and third CCAs can be axially aligned in the axial direction. The first apertures of the second and third CCAs can be aligned in the axial direction, and the second apertures of the second and third CCAs are aligned in the axial direction. The first second and third power wires can be uninsulated and are in electrical contact with one another at a first electrical potential, and the first second and third return wires can be uninsulated and can be in electrical contact with one another at a second electrical potential.

A method includes connecting a first circuit card assembly (CCA) to a power bus, and stacking a second CCA onto the first CCA and threading the first power bus through an aperture in the second CCA. The method includes connecting the second CCA to a second power bus. The method can include stacking a third CCA onto the second CCA, threading the first and second power buses through an aperture in the third CCA, and connecting a third power bus to the third CCA.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 1 is a schematic perspective view of an embodiment of a circuit card assembly (CCA) stack constructed in accordance with the present disclosure, showing the passage of the power busses through apertures in the stack.

DETAILED DESCRIPTION OF THE PREFERRED EMBODIMENTS

Reference will now be made to the drawings wherein like reference numerals identify similar structural features or aspects of the subject disclosure. For purposes of explanation and illustration, and not limitation, a partial view of an embodiment of a circuit card assembly (CCA) stack in accordance with the disclosure is shown in FIG. 1 and is designated generally by reference character 100. The systems and methods described herein can be used to deliver relatively high current (relative to signal transmission) to the CCAs in a stack of CCAs while providing flexibility for the stack to compress, e.g. in high acceleration applications and the like.

The circuit card assembly (CCA) stack 100 includes a first circuit card assembly (CCA) 102 with circuit components 104 mounted thereto. The first CCA 102 includes a power contact 106 and a return contact 108 for powering the first CCA 102. A plurality of additional CCAs 110, 112, 114, 116 in a stack with the first CCA 102. Each CCA in the plurality of additional CCAs 110, 112, 114, 116 includes a respective power contact 118, 120, 122, 124 and a respective return contact 126, 128, 130, 132, and respective circuit components 134, 136, 138, 140 mounted thereto. Each CCA in the plurality of additional CCAs 110, 112, 114, 116 includes a respective first aperture 142, 144, 146, 148 and a second aperture 150, 152, 154, 156 for passage of power buses 158.

The respective first apertures 142, 144, 146, 148 of the additional CCAs 110, 112, 114, 116 increase in size the further the respective one of the additional CCAs is in the stack 100 from the first CCA 102. Similarly, the respective second apertures 150, 152, 154, 156 of the additional CCAs 110, 112, 114, 116 increase in size the further the respective one of the additional CCAs is in the stack 100 from the first CCA 102. This increase in size allows each successive CCA 110, 112, 114, 116 to pass through more wires than the CCA's above it in the stack as oriented in FIG. 1. The power wires 160, 164, 168, 172, 174 can be uninsulated and can thus be in electrical contact with one another at a first electrical potential. The return wires 162, 166, 170, 176, 178 can also be uninsulated and can be in electrical contact with one another at a second electrical potential. The power and return contacts 118, 120, 122, 124, 126, 128, 130, 132 of each CCA 110, 112, 114, 116 are between the first and second apertures 142, 150, 144, 152, 146, 154, 148, 156 of the respective CCA.

The power contacts 106, 118, 120, 122, 124 and return contacts 108, 126, 128, 130, 132 are plated vias. The first CCA 102 has a first power bus 158 that is electrically connected to the first CCA 102. The first power bus 158 includes a first power wire 160 bonded to the power contact 106 of the first CCA 102. The first power bus 158 also includes a first return wire 162 bonded to the return contact 108 of the first CCA 102.

The second CCA 110 is stacked onto the first CCA 102, wherein the wires 160, 162 of the first power bus 158 pass through the respective apertures 142, 150 in the second CCA 110. The first power wire 160 passes loosely through the first aperture 142. The first return wire 162 passes loosely through the second aperture 150. This looseness allows the first and second CCAs 102 and 110 to compress relative to one another along the direction of the stack axis A without damaging the wires 160, 162.

A second power bus 158 is electrically connected to the second CCA 110. The second power bus 158 includes a second power wire 164 bonded to the power contact 118 of the second CCA 110. The second power bus 158 also includes a second return wire 166 bonded to the return contact 126 of the second CCA 110.

A third CCA 112 is stacked onto the second CCA 110. The first and second power buses 158 both pass through the apertures 144, 152 in the third CCA. The first and second power wires 160, 164 both pass loosely through the first aperture 144 of the third CCA 112. The first and second return wires 162, 166 both pass loosely through the second aperture 152 of the third CCA 112. This looseness allows relative movement of the first, second, and third CCAs 102, 110, 112 without damaging the wires 160, 164, 162, 166.

The third power bus 158 is electrically connected to the third CCA 112 as follows. The third power bus 158 includes a third power wire 168 bonded to the power contact 120 of the third CCA 112. The third power bus 158 also includes a third return wire 170 bonded to the return contact 128 of the third CCA 112. Those skilled in the art will readily appreciate that the fourth and fifth CCAs 114 and 116 are similarly connected to the stack 100, continuing the same pattern described above with respect to the second and third CCAs 110, 112.

The first power wire 160 passes loosely through the apertures 142, 144, 146, and 148. The second power wire 164 passes loosely through the apertures 144, 146, 148. The third power wire 168 passes through the apertures 146, 148. The fourth power wire 172 passes loosely through the aperture 148 and is ponded to the power contact 122 of the fourth CCA 114. The fifth power wire 174 is bonded to the power contact 124 of the fifth CCA 116.

The second return wire 162 passes loosely through the apertures 150, 152, 154, 156. The second return wire 166 passes loosely through the apertures 152, 154, 156. The third return wire 170 passes loosely through the apertures 154, 156. The fourth return wire 176 passes loosely through the aperture 156, and is bonded to the return contact 130 of the fourth CCA. The fifth return wire 178 is bonded to the return contact of the fifth CCA 116. The apertures 142, 144, 146, 148, 150, 152, 154, 156 are non-plated holes, and provide radial constraint to the wires 160, 164, 168, 172, 174, 162, 166, 170, 176, 178. The contacts 106, 118, 120, 122, 124, 108, 150, 152, 154, 156 are connected to traces for powering the circuit components 104, 134, 136, 138, 140. Those skilled in the art having had the benefit of this disclosure will readily appreciate that any suitable number of CCAs can be stacked in this manner without departing from the scope of this disclosure.

The power contacts 106, 118, 120, 122, 124 are all axially aligned in the axial direction relative to the stack axis A. Similarly, the return contacts 108, 150, 152, 154, 156 are axially aligned in the axial direction. The first apertures 142, 144, 146, 148 are aligned in the axial direction, and the second apertures 150, 152, 154, 156 are aligned in the axial direction.

A method includes connecting a first circuit card assembly (CCA), e.g., CCA 102, to a power bus, e.g. power bus 158, and stacking a second CCA, e.g., CCA 110, onto the first CCA and threading the first power bus, e.g., wires 160, 162, through an aperture, e.g. apertures 142, 150, in the second CCA. The method includes connecting the second CCA to a second power bus. The method can include stacking a third CCA, e.g., CCA 112, onto the second CCA, threading the first and second power buses, e.g., wires 160, 164, 162, 166, through an aperture, e.g. apertures 144, 152 in the third CCA, and connecting a third power bus, e.g., wires 168, 170 to the third CCA. Any suitable number of additional CCAs can be stacked onto the stack, e.g., stack 100.

Potential advantages of systems and methods disclosed herein are as follows. This disclosure allows for thicker gauge conductors, needed for higher amperage, to be utilized in a smaller space than in conventional connectors. It also provides a method for tightly packing power conduction within the diameter or perimeter of the CCA boards, the surface area of which can mostly to near fully be covered with circuit components. The use of through holes allows for the entire CCA stack to be compressed at a subassembly or full assembly level because the wires, after installation, are able to slide though these through holes to account for stack height loss due to compression. Slightly twisting the wire bundles as a final step can create a multi-strand bus bar, improving the wire bundle's strength characteristics and electrical conduction. Bare wires can have clearance from other conductive parts and can be isolated using short lengths of shrink tubing, or the like, between boards (CCAs) or with other insulating materials such as a non-conductive potting. If the bundle of wires has not been twisted, or rendered permanently fixed with potting, the whole stack of CCAs can be separated (as in cases of engineering units) where modifications may be needed to the design, or in production where rework may be necessary. Wires can be sufficiently stiff and thick so they can be threaded into the through holes. Wires soldered to vias can make a more mechanically robust connection than surface mounted power connectors.

The methods and systems of the present disclosure, as described above and shown in the drawings, provide for delivering relatively high current (relative to signal transmission) to the CCAs in a stack of CCAs while providing flexibility for the stack to compress, e.g. in high acceleration applications and the like. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A circuit card assembly (CCA) stack comprising: a first circuit card assembly (CCA) with circuit components mounted thereto, with a first power bus electrically connected to the first CCA; and a second CCA with circuit components mounted thereto, the second CCA being stacked onto the first CCA, wherein the first power bus passes through an aperture in the second CCA, wherein a second power bus is electrically connected to the second CCA; a third CCA with circuit components mounted thereto, the third CCA being stacked onto the second CCA, wherein the first and second power buses pass through an aperture in the third CCA, wherein the aperture in the third CCA is larger than the aperture in the second CCA, and wherein a third power bus is electrically connected to the third CCA.

2. The CCA stack as recited in claim 1, wherein the first power bus includes a first power wire bonded to a power contact of the first CCA, and wherein the first power bus includes a first return wire bonded to a return contact of the first CCA.

3. The CCA stack as recited in claim 2, wherein the aperture in the second CCA is a first aperture, wherein the first power wire passes through the first aperture of the second CCA, wherein the second CCA includes a second aperture, and wherein the first return wire passes through the second aperture of the second CCA.

4. The CCA stack as recited in claim 3, wherein the first power wire passes loosely through the first aperture of the second CCA, and wherein the first return wire passes loosely through the second aperture of the second CCA.

5. The CCA stack as recited in claim 1, wherein the second power bus includes a second power wire bonded to a power contact of the second CCA, and wherein the second power bus includes a second return wire bonded to a return contact of the second CCA.

6. The CCA stack as recited in claim 5, wherein the aperture in the third CCA is a first aperture, wherein the first and second power wires pass through the first aperture of the third CCA, wherein the third CCA includes a second aperture, and wherein the first and second return wires pass through the second aperture of the third CCA.

7. The CCA stack as recited in claim 6, wherein the first and second power wires pass loosely through the first aperture of the third CCA, and wherein the first and second return wires pass loosely through the second aperture of the third CCA.

8. The CCA stack as recited in claim 7, wherein the first aperture of the third CCA is larger than the first aperture of the second CCA, and wherein the second aperture of the third CCA is larger than the second aperture of the second CCA.

9. The CCA stack as recited in claim 8, wherein the third power bus includes a third power wire bonded to a power contact of the third CCA, and wherein the third power bus includes a third return wire bonded to a return contact of the third CCA.

10. The CCA stack as recited in claim 9, wherein the power contacts of the first, second, and third CCAs are axially aligned in an axial direction relative to a stack axis along which the first, second, and third CAAs are stacked, and wherein the return contacts of the first, second, and third CCAs are axially aligned in the axial direction.

11. The CCA stack as recited in claim 10, wherein the first apertures of the second and third CCAs are aligned in the axial direction, and wherein the second apertures of the second and third CCAs are aligned in the axial direction.

12. The CCA stack as recited in claim 11, wherein the power and return contacts of the second CCA are between the first and second apertures of the second CCA, and wherein the power and return contacts of the third CCA are between the first and second apertures of the third CCA.

13. The CCA stack as recited in claim 9, wherein the first second and third power wires are uninsulated and are in electrical contact with one another at a first electrical potential; and wherein the first second and third return wires are uninsulated and are in electrical contact with one another at a second electrical potential.

14. A circuit card assembly (CCA) stack comprising: a first circuit card assembly (CCA) with circuit components mounted thereto, wherein the first CCA includes a power contact and a return contact for powering the first CCA; and a plurality of additional CCAs in a stack with the first CCA, wherein each CCA in the plurality of additional CCAs includes respective power and return contacts, wherein each CCA in the plurality of additional CCAs includes a first aperture and a second aperture for passage of power buses, wherein the respective first apertures of the additional CCAs increase in size the further the respective one of the additional CCAs is in the stack from the first CCA, and wherein the respective second apertures of the additional CCAs increase in size the further the respective one of the additional CCAs is in the stack from the first CCA.

15. The CCA stack as recited in claim 14, wherein the power and return contacts of each CCA in the plurality of additional CCAs are between the first and second apertures of the respective CCA.

16. The CCA stack as recited in claim 14, wherein the respective power and return contacts are plated vias.

17. A method comprising: connecting a first circuit card assembly (CCA) to a power bus; stacking a second CCA onto the first CCA and threading the first power bus through an aperture in the second CCA; connecting the second CCA to a second power bus, stacking a third CCA onto the second CCA; threading the first and second power buses through an aperture in the third CCA, the aperture in the third CCA is larger than the aperture in the second CCA; and connecting a third power bus to the third CCA.

\* \* \* \* \*